United States Patent
Won

(10) Patent No.: US 7,233,213 B2
(45) Date of Patent: Jun. 19, 2007

(54) OSCILLATOR OF SEMICONDUCTOR DEVICE

(75) Inventor: Sam Kyu Won, Icheon-si (KR)

(73) Assignee: Hynix Semiconductor Inc., Kyoungki-Do (KR)

(*) Notice: Subject to any disclaimer, the term of this patent is extended or adjusted under 35 U.S.C. 154(b) by 74 days.

(21) Appl. No.: 11/125,109

(22) Filed: May 10, 2005

(65) Prior Publication Data

US 2006/0097813 A1 May 11, 2006

(30) Foreign Application Priority Data

Nov. 11, 2004 (KR) .................. 10-2004-0092096

(51) Int. Cl.
*H03B 5/24* (2006.01)
*H03K 3/02* (2006.01)

(52) U.S. Cl. ............... 331/143; 331/153; 331/173; 331/185

(58) Field of Classification Search .......... 331/74–75, 331/111, 113 R, 143–145, 153, 175, 185–186, 331/173
See application file for complete search history.

(56) References Cited

U.S. PATENT DOCUMENTS 6,917,249 B1* 7/2005 Kuo et al. .................. 331/143

FOREIGN PATENT DOCUMENTS

KR         100265611         6/2000

* cited by examiner

*Primary Examiner*—David Mis
(74) *Attorney, Agent, or Firm*—Lowe Hauptman & Berner LLP

(57) ABSTRACT

An oscillator of a semiconductor memory device, wherein a reference voltage that flexibly shifts according to the shift in a power supply voltage is generated, and a reference clock is generated using the reference voltage. It is thus possible to generate the reference clock having a constant cycle regardless of the shift in the power supply voltage which can keep constant the duration period of internal control signals of devices, such as a timer and a pump circuit, which are synchronized to the reference clock.

23 Claims, 2 Drawing Sheets

OSCILLATOR OF SEMICONDUCTOR DEVICE

BACKGROUND

1. Field of the Invention

The present invention relates to an oscillator of a semiconductor memory device, and more specifically, to an oscillator of a semiconductor memory device, wherein the duration period of an internal control signal can be kept constant by generating a reference clock having a constant clock cycle regardless of variation in a power supply voltage.

2. Discussion of Related Art

In a semiconductor chip, an oscillator is used to generate a reference clock of a pump or a timer. The reference clock used for the timer plays an important role in deciding the duration period of a control signal used in the chip. As such, variation in the cycle of the reference clock has influence on specification of a product.

For example, in NAND type flash memory devices, variation in the cycle of the reference clock is closely connected with a read access time, which is a time taken to read data from memory cells. If the cycle of the reference clock reduces, the read access time reduces. In this case, however, there occurs a case where data of the memory cells are not exactly sensed because all control signals of an internal chip operation are reduced.

As described above, since the oscillator has a great effect on the operation of a chip, it must be designed to be less sensitive to variation in PVT (Process/Voltage/Temperature). In a conventional oscillator, however, a clock cycle frequently shifts according to variation in a power supply voltage. Therefore, it is very difficult to keep the duration period of internal control signals constant.

SUMMARY OF THE INVENTION

Accordingly, the present invention has been made in view of the above problems, and it is an object of the present invention to provide an oscillator of a semiconductor memory device, wherein the duration period of an internal control signal can be kept constant by generating a reference clock having a constant clock cycle regardless of variation in a power supply voltage.

To achieve the above object, according to an aspect of the present invention, there is provided an oscillator of a semiconductor memory device, wherein the oscillator compares a reference voltage, and a voltage generated according to a predetermined RC delay value, and generates a reference clock according to the comparison result, the oscillator comprising a reference voltage generator for generating the reference voltage in such a way that the reference voltage shifts corresponding to a shift in a power supply voltage, wherein the reference voltage generator is enabled by an enable bar signal.

According to another aspect of the present invention, there is provided an oscillator of a semiconductor memory device, comprising a first voltage generator for generating a first voltage according to a first RC delay value, a second voltage generator for generating a second voltage according to a second RC delay value, a reference voltage generator for generating a reference voltage that shifts corresponding to a shift in a power supply voltage, a first comparator for comparing the first voltage and the reference voltage, a second comparator for comparing the second voltage and the reference voltage, and logic combination units for latching output signals of the first and second comparators to generate a reference clocks, wherein the reference voltage generator is enabled by an enable bar signal.

DETAILED DESCRIPTION OF PREFERRED EMBODIMENTS

Now, the preferred embodiments according to the present invention will be described with reference to the accompanying drawings. Since embodiments are provided for the purpose that the ordinary skilled in the art are able to understand the present invention, they may be modified in various manners and the scope of the present invention is not limited by the embodiments described later.

Figure 1:
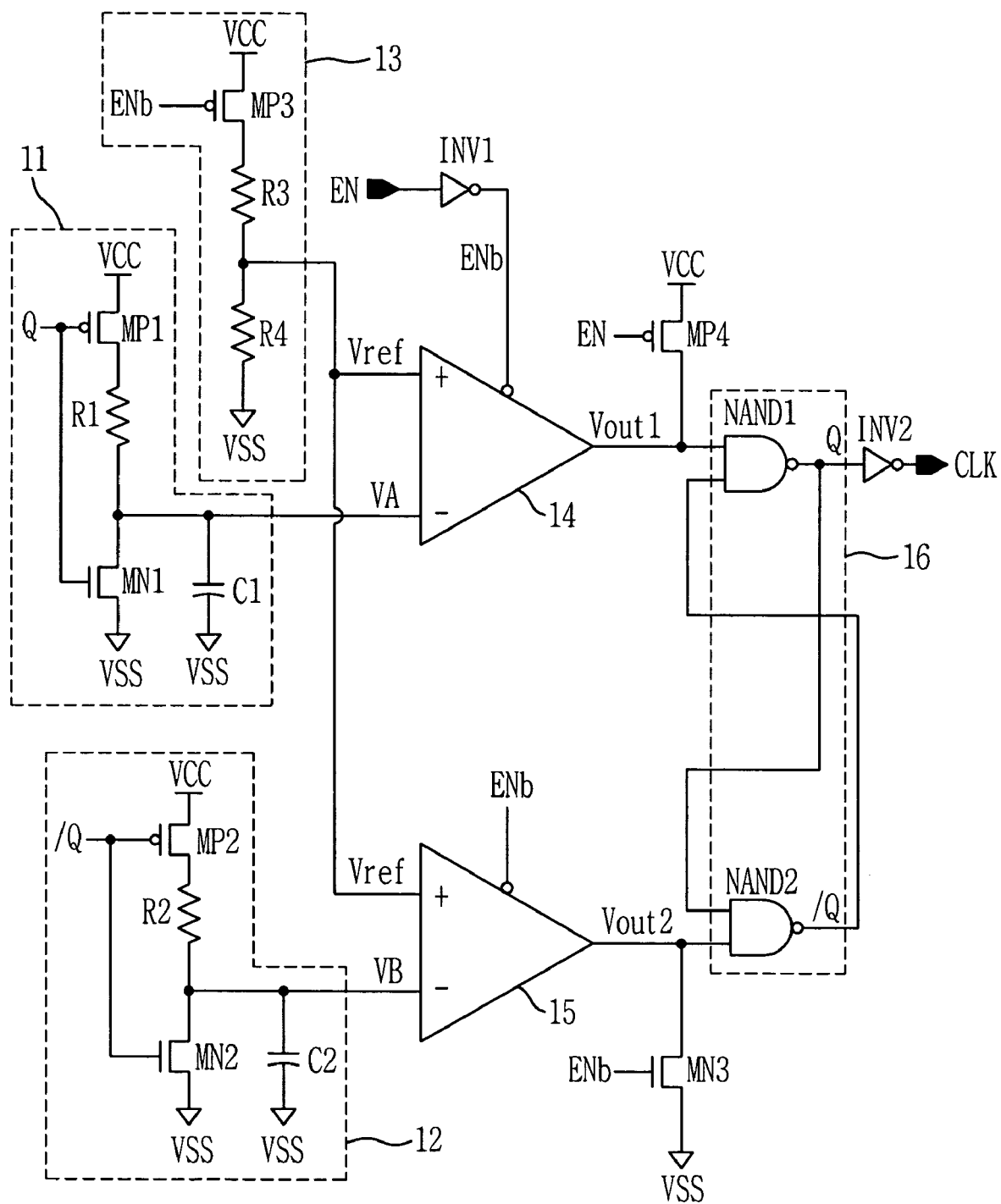
FIG. 1 is a circuit diagram showing an oscillator of a semiconductor device according to an embodiment of the present invention.

FIG. 1 is a circuit diagram showing an oscillator of a semiconductor device according to an embodiment of the present invention. For example, a RC type oscillator is shown in FIG. 1.

Referring to FIG. 1, the oscillator of the semiconductor device includes a reference voltage generation circuit 13 for flexibly shifting voltages VA and VB having a predetermined voltage level, which are generated according to RC delay values respectively set by first and second voltage generation circuits 11 and 12, and a target reference voltage Vref, corresponding to variation in a power supply voltage Vcc.

The reference voltage generation circuit 13 generates the reference voltage Vref by dividing the power supply voltage Vcc according to an enable bar signal Enb. To this end, the reference voltage generation circuit 13 can include a PMOS transistor MP3, resistors R3 and R4 which are serially connected between a power supply voltage source and a ground voltage source wherein the PMOS transistor MP3 is turned on according to the enable bar signal Enb. The reference voltage Vref can be expressed into the following Equation 1. At this time, a threshold voltage of the PMOS transistor MP3 is disregarded.

$$Vref = [R3/(R3+R4)] \times Vcc \quad (1)$$

As shown in Equation 1, the reference voltage Vref is decided according to the resistors R3, R4, and the power supply voltage Vcc. The resistors R3, R4 have fixed constant values, and the value of the reference voltage Vref is thus decided according to the power supply voltage Vcc. In other words, the power supply voltage Vcc is a function of the reference voltage Vref, and the value of the reference voltage Vref is decided depending upon the power supply voltage Vcc in a proportional manner.

First and second voltage generation circuits 11, 12 generate the voltages VA, VB having a different voltage level depending upon set RC delay values. The first voltage generation circuit 11 serves to invert a signal that is output to a first output terminal Q of a logic combination unit 16. The second voltage generation circuit 12 serves to invert a signal that is output to a second output terminal /Q of the logic combination unit 16.

In the first voltage generation circuit 11, the RC delay value is decided by a resistor R1 and a capacitor C1. Accordingly, the voltage VA gradually increases according to the amount of the resistor R1 and the capacitor C1, depending upon the signal of the first output terminal Q of the logic combination unit 16. To this end, the first voltage generation circuit 111 includes a PMOS transistor MP1 and a NMOS transistor MN1, which are serially connected between a power supply voltage source and a ground voltage source, and serve as inverters for inverting the signal of the first output terminal Q of the logic combination unit 16, a resistor R1 connected between the PMOS transistor MP1 and the NMOS transistor MN1, and a capacitor C1 connected to the NMOS transistor MN1 in a parallel manner.

In the second voltage generation circuit 12, the RC delay value is decided by a resistor R2 and a capacitor C2. Therefore, the voltage VB gradually increases according to the amount of the resistor R2 and the capacitor C2, depending upon the signal of the second output terminal /Q of the logic combination unit 16. For this purpose, the second voltage generation circuit 12 includes a PMOS transistor MP2 and a NMOS transistor MN2, which are serially connected between a power supply voltage source and a ground voltage source, and serve as inverters for inverting the signal of the second output terminal /Q of the logic combination unit 16, a resistor R2 connected between the PMOS transistor MP2 and the NMOS transistor MN2, and a capacitor C2 connected to the NMOS transistor MN2 in a parallel manner.

A first comparator 14 is enabled by the enable bar signal Enb, compares the voltage VA of the first voltage generation circuit 11 and the reference voltage Vref, and outputs a voltage Vout1 having a predetermined voltage level (HIGH or LOW level) according to the comparison result. For example, the first comparator 14 can be enabled when the enable bar signal Enb is at a LOW level. In a state where the first comparator 14 is enabled, if the voltage VA is lower than the reference voltage Vref, the first comparator 14 outputs the output voltage Vout1 of a HIGH level. On the other hand, if the voltage VA is higher than the reference voltage Vref, the first comparator 14 outputs the output voltage Vout1 of a LOW level.

In the same manner as the first comparator 14, a second comparator 15 is enabled according to the enable bar signal ENb and compares the voltage VB of the second voltage generation circuit 12 and the reference voltage Vref, and outputs the voltage Vout2 having a predetermined voltage level according to the comparison result. For example, when the enable bar signal ENb is at a LOW level, the second comparator 15 is enabled. In a state where the second comparator 15 is enabled, if the voltage VB is lower than the reference voltage Vref, the second comparator 15 outputs the output voltage Vout2 of a HIGH level. On the other hand, if the voltage VB is higher than the reference voltage Vref, the second comparator 15 outputs the output voltage Vout2 of a LOW level.

The logic combination unit 16 can be composed of a SR latch for latching the output voltages Vout1, Vout2 of the first and second comparators 14, 15. The logic combination unit 16 includes a NAND gate NAND1 for performing a NAND operation on the output voltage Vout1 of the first comparator 14 and a signal of the second output terminal /Q, and a NAND gate NAND2 for performing a NAND operation on the output terminal Vout2 of the second comparator 15 and a signal of the first output terminal Q.

For example, the NAND gate NAND1 can output a signal of a HIGH level regardless of the output voltage Vout1, when an output signal of the second output terminal /Q is at a LOW level, and output a signal of a LOW level or a HIGH level according to the output voltage Vout1, when the output signal of the second output terminal /Q is at a HIGH level. That is, if the output voltage Vout1 is at the LOW level, the NAND gate NAND1 outputs the signal of the HIGH level. If the output voltage Vout1 is at the HIGH level, the NAND gate NAND1 outputs the signal of the LOW level. The NAND gate NAND2 outputs a signal of a HIGH level regardless of the output voltage Vout2 when the output signal of the first output terminal Q is at a LOW level, and outputs a signal of a LOW level according to the output voltage Vout2 when the output signal of the first output terminal Q is at a HIGH level. In other words, if the output voltage Vout2 is at the LOW level, the NAND gate NAND2 outputs the signal of the HIGH level. If the output voltage Vout2 is at the HIGH level, the NAND gate NAND2 outputs the signal of the LOW level.

The oscillator of the semiconductor device according to a preferred embodiment of the present invention can further include first and second setting units for maintaining the output terminal of the first comparator 14 in a HIGH level and the output terminal of the second comparator 15 in a LOW level, in order to set an initial value of the oscillator.

The first setting unit includes a PMOS transistor MP4, which is connected between a power supply voltage source and the output terminal of the first comparator 14, and turned on according to an enable signal EN. The second setting unit includes a NMOS transistor MN3, which is connected between a ground voltage source and the output terminal of the second comparator 15, and turned on according to an enable bar signal ENb.

Operating characteristics of the oscillator of the semiconductor device described above will be described below with reference to an operational waveform of FIG. 2.

Figure 2:
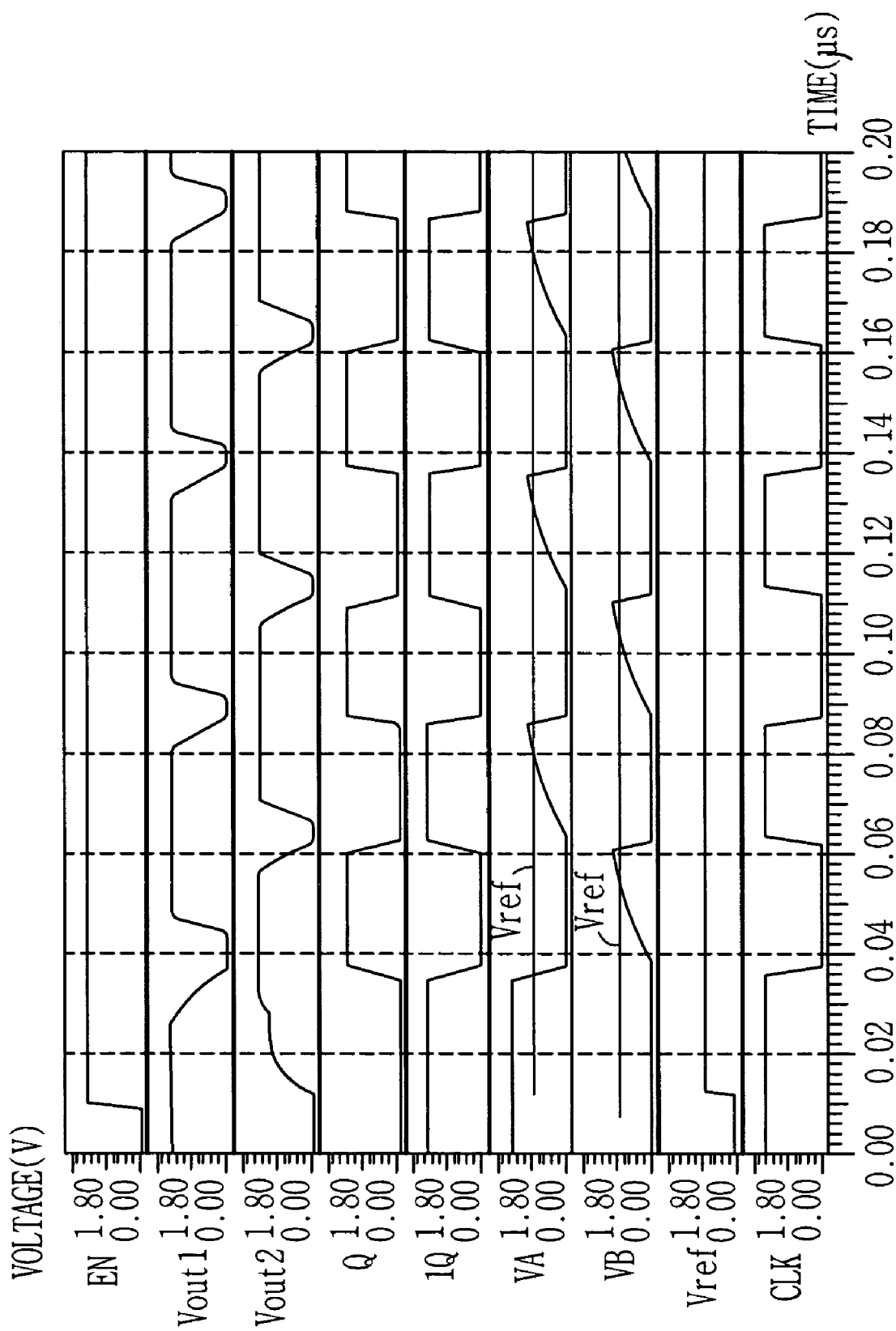
FIG. 2 shows an operational waveform of the oscillator shown in FIG. 1.

As shown in FIG. 2, at an initial stage, as the enable signal EN is input as a LOW level, the oscillator is disabled. At this time, the output voltage Vout1 of the first comparator 14 becomes a HIGH level by means of the PMOS transistor MP4. On the other hand, the output voltage Vout2 of the second comparator 15 becomes a LOW level by means of the NMOS transistor MN3. Accordingly, the first output terminal Q of the logic combination unit 16 becomes a LOW level, and the second output terminal /Q thereof becomes a HIGH level.

In this state, if the oscillator is enabled as the enable signal EN shifts from the LOW level to a HIGH level, the PMOS transistor MP3 is turned, and the reference voltage Vref is generated according to the power supply voltage Vcc. Furthermore, since the PMOS transistor MP1 is turned according to the signal of the LOW level of the first output terminal Q, the voltage VA slowly increases toward the RC delay value of the resistor R1 and the capacitor C1 according to the power supply voltage Vcc. After a predetermined time elapses, if the voltage VA rises over the reference voltage Vref, the first comparator 14 shifts from the HIGH level to a LOW level. Accordingly, the first output terminal Q of the logic combination unit 16 shifts from the LOW level to a HIGH level, and the second output terminal /Q thereof shifts from the HIGH level to a LOW level. As the second output terminal /Q shifts to the LOW level, the PMOS transistor MP2 is turned on, and the voltage VB slowly increases toward the RC delay value of the resistor R2 and the capacitor C2 according to the power supply voltage Vcc. After a predetermined time elapses, if the voltage VB rises over the reference voltage Vref, the second comparator 15 shifts from the HIGH level to a LOW level. Therefore, the second output terminal /Q of the logic combination unit 16 shifts from the LOW level to a HIGH level, and the second output terminal Q therefore shifts from the HIGH level to a LOW level. If this process is repeatedly performed, a clock CLK having a predetermined cycle is generated.

Meanwhile, the cycle of the clock CLK output from the oscillator of the semiconductor device according to a preferred embodiment of the present invention is kept constant. The reason will be described as follows.

First, the clock cycle T of the oscillator of the semiconductor device can be expressed into the following Equation 2.

$$T=2 \times RC \times \ln[1+Vref/(Vcc-Vref)] \qquad (2)$$

As in Equation 2, the clock cycle T is a function of the power supply voltage Vcc. Assuming that the reference voltage Vref keeps constant, if the power supply voltage Vcc increases, the clock cycle T reduces. That is, the clock cycle T frequently shifts depending upon the shift in the power supply voltage Vcc.

Accordingly, the oscillator of the semiconductor device is constructed so that the reference voltage Vref flexibly shifts according to the shift in the power supply voltage Vcc. In other words, the reference voltage Vref increases or reduces in proportional to the power supply voltage Vcc. As a result, the reference voltage Vref can be expressed into the following Equation 3.

$$Vref=a \times Vcc \qquad (3)$$

As in Equation 3, if the reference voltage Vref shifts in proportional to the shift in the power supply voltage Vcc, the clock cycle T can be expressed into the following Equation 4.

$$T=2 \times RC \times \ln[1+a/(1-a)] \qquad (4)$$

As shown in Equation 4, the clock cycle T of the oscillator of the semiconductor device can keep constant regardless of the shift in the power supply voltage Vcc.

As described above, according to the present invention, a reference voltage that flexibly shifts according to the shift in a power supply voltage is generated, and a reference clock is generated using the reference voltage. It is thus possible to generate the reference clock having a constant cycle regardless of the shift in the power supply voltage. Accordingly, the present invention is advantageous in that it can keep constant the duration period of internal control signals of devices, which are synchronized to a reference clock.

Although the foregoing description has been made with reference to embodiments, it is to be understood that changes and modifications of the present invention may be made by the ordinary skilled in the art without departing from the spirit and scope of the present invention and appended claims.

What is claimed is:

1. An oscillator of a semiconductor memory device, the oscillator comprising:
   a reference voltage generator for generating a reference voltage in such a way that the reference voltage shifts corresponding to a shift in a power supply voltage, wherein
   the oscillator compares the reference voltage with a voltage generated according to a predetermined RC delay value, and generates a reference clock according to the comparison result, and
   the reference voltage generator is enabled by an enable bar signal.

2. An oscillator of a semiconductor memory device, comprising:
   a first voltage generator for generating a first voltage according to a first RC delay value;
   a second voltage generator for generating a second voltage according to a second RC delay value;
   a reference voltage generator for generating a reference voltage that shifts corresponding to a shift in a power supply voltage;
   a first comparator for comparing the first voltage and the reference voltage;
   a second comparator for comparing the second voltage and the reference voltage; and
   logic combination units for latching output signals of the first and second comparators to generate a reference clock;
   wherein the reference voltage generator is enabled by an enable bar signal.

3. The oscillator as claimed in claim 2, wherein the reference voltage generator generates the reference voltage by dividing the power supply voltage.

4. The oscillator as claimed in claim 2, wherein the reference voltage generator comprises:
   a PMOS transistor that operates according to the enable bar signal; and
   first and second resistors for dividing the power supply voltage transferred through the PMOS transistor to generate the reference voltage.

5. The oscillator as claimed in claim 2, wherein the first voltage generator comprises:
   an inverter for inverting an output signal of a first one of the logic combination units;
   a resistor connected between a PMOS transistor of the inverter and an output terminal from which the first voltage is output; and
   a capacitor connected to the output terminal and a ground voltage source.

6. The oscillator as claimed in claim 2, wherein the second voltage generator comprises:
   an inverter for inverting an output signal of a second one of the logic combination units;
   a resistor connected between a PMOS transistor of the inverter and an output terminal from which the second voltage is output; and
   a capacitor connected to the output terminal and a ground voltage source.

7. The oscillator as claimed in claim 2, wherein the first and second comparators are enabled by the enable bar signal.

8. The oscillator as claimed in claim 2, wherein each of the logic combination units is composed of a SR latch.

9. An oscillator, comprising:
   a first voltage generator for generating a first voltage according to a first RC delay value;
   a second voltage generator for generating a second voltage according to a second RC delay value;
   a reference voltage generator for generating a reference voltage that shifts corresponding to a shift in a power supply voltage;
   a first comparator for comparing the first voltage and the reference voltage;
   a second comparator for comparing the second voltage and the reference voltage; and
   logic combination units for latching output signals of the first and second comparators to generate a reference clock,
   wherein the reference voltage generator is enabled by an enable bar signal.

10. The oscillator as claimed in claim 9, wherein the reference voltage generator generates the reference voltage by dividing the power supply voltage.

11. The oscillator as claimed in claim 9, wherein the reference voltage generator comprises:
   a PMOS transistor that operates according to the enable bar signal; and
   first and second resistors for dividing the power supply voltage transferred through the PMOS transistor to generate the reference voltage.

12. The oscillator as claimed in claim 9, wherein the first voltage generator comprises:
   an inverter for inverting an output signal of a first one of the logic combination units;
   a resistor connected between a PMOS transistor of the inverter and an output terminal from which the first voltage is output; and
   a capacitor connected to the output terminal and a ground voltage source.

13. The oscillator as claimed in claim 9, wherein the second voltage generator comprises:
   an inverter for inverting an output signal of a second one of the logic combination units;
   a resistor connected between a PMOS transistor of the inverter and an output terminal from which the second voltage is output; and
   a capacitor connected to the output terminal and a ground voltage source.

14. The oscillator as claimed in claim 9, wherein the first and second comparators are enabled by the enable bar signal.

15. The oscillator as claimed in claim 9, wherein each of the logic combination units is composed of a SR latch.

16. A semiconductor device, comprising:
   an oscillator, comprising:
   a reference voltage generator for generating a reference voltage in such a way that the reference voltage shifts corresponding to a shift in a power supply voltage;
   wherein the oscillator compares the reference voltage with a voltage generated according to a predetermined RC delay value, and generates a reference clock according to the comparison result; and
   wherein the reference voltage generator is enabled by an enable bar signal.

17. A semiconductor device, comprising:
   an oscillator, comprising:
   a first voltage generator for generating a first voltage according to a first RC delay value;
   a second voltage generator for generating a second voltage according to a second RC delay value;
   a reference voltage generator for generating a reference voltage that shifts corresponding to a shift in a power supply voltage;
   a first comparator for comparing the first voltage and the reference voltage;
   a second comparator for comparing the second voltage and the reference voltage; and
   logic combination units for latching output signals of the first and second comparators to generate a reference clock;
   wherein the reference voltage generator is enabled by an enable bar signal.

18. The device as claimed in claim 17, wherein the reference voltage generator generates the reference voltage by dividing the power supply voltage.

19. The device as claimed in claim 17, wherein the reference voltage generator comprises:
   a PMOS transistor that operates according to the enable bar signal; and
   first and second resistors for dividing the power supply voltage transferred through the PMOS transistor to generate the reference voltage.

20. The device as claimed in claim 17, wherein the first voltage generator comprises:
   an inverter for inverting an output signal of a first one of the logic combination units;
   a resistor connected between a PMOS transistor of the inverter and an output terminal from which the first voltage is output; and
   a capacitor connected to the output terminal and a ground voltage source.

21. The device as claimed in claim 17, wherein the second voltage generator comprises:
   an inverter for inverting an output signal of a second one of the logic combination units;
   a resistor connected between a PMOS transistor of the inverter and an output terminal from which the second voltage is output; and
   a capacitor connected to the output terminal and a ground voltage source.

22. The device as claimed in claim 17, wherein the first and second comparators are enabled by the enable bar signal.

23. The device as claimed in claim 17, wherein each of the logic combination units is composed of a SR latch.

* * * * *